(12) United States Patent
Ogawa et al.

(10) Patent No.: US 7,632,749 B1
(45) Date of Patent: Dec. 15, 2009

(54) SEMICONDUCTOR DEVICE HAVING A PAD METAL LAYER AND A LOWER METAL LAYER THAT ARE ELECTRICALLY COUPLED, WHEREAS APERTURES ARE FORMED IN THE LOWER METAL LAYER BELOW A CENTER AREA OF THE PAD METAL LAYER

(75) Inventors: Hiroyuki Ogawa, Sunnyvale, CA (US); Yider Wu, Campbell, CA (US); Nian Yang, Mountain View, CA (US); Kuo-Tung Chang, Saratoga, CA (US); Yu Sun, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/823,970

(22) Filed: Apr. 13, 2004

(51) Int. Cl.
*H01L 21/44* (2006.01)

(52) U.S. Cl. ............... 438/612; 257/774; 257/E21.508; 257/E21.509; 257/E21.519

(58) Field of Classification Search ................. 257/698, 257/748, 781, 782, 784, 786, 758, 774, 776, 257/E21.508, E21.509, E21.519; 438/612, 438/614, 637, 617
See application file for complete search history.

(56) References Cited

U.S. PATENT DOCUMENTS

| 5,248,903 | A | * | 9/1993 | Heim | .......................... 257/748 |
| 5,736,791 | A | * | 4/1998 | Fujiki et al. | ................. 257/781 |
| 6,756,675 | B1 | * | 6/2004 | Tanaka | ........................ 257/758 |
| 6,765,228 | B2 | * | 7/2004 | Lin et al. | ....................... 257/48 |

* cited by examiner

*Primary Examiner*—Quoc D Hoang

(57) ABSTRACT

A semiconductor device is disclosed and provided. The semiconductor device includes a pad metal layer having a perimeter area and a center area. Further, the semiconductor device has a lower metal layer having a plurality of apertures below the center area of the pad metal layer. Moreover, an interlayer dielectric is formed between the pad metal layer and the lower metal layer. In an embodiment, the semiconductor device also includes a plurality of vias formed in the interlayer dielectric. The vias electrically couple the pad metal layer and the lower metal layer. Additionally, the vias are located below the perimeter area of the pad metal layer.

5 Claims, 7 Drawing Sheets

SEMICONDUCTOR DEVICE HAVING A PAD METAL LAYER AND A LOWER METAL LAYER THAT ARE ELECTRICALLY COUPLED, WHEREAS APERTURES ARE FORMED IN THE LOWER METAL LAYER BELOW A CENTER AREA OF THE PAD METAL LAYER

BACKGROUND OF THE INVENTION

1. Field of the Invention

The present invention generally relates to semiconductor devices. More particularly, the present invention relates to the electrically coupling a pad metal layer and a lower metal layer in a semiconductor device.

2. Related Art

The semiconductor fabrication process generally includes a probing process. In the probing process, a probe instrument is utilized to make mechanical and electrical contact with the exposed surface of the pad metal of an integrated circuit chip (or die). Voltage or current is then applied through the probe instrument to test for functionality. Unfortunately, the probe instrument may induce stress on the pad metal such that the stress propagates to lower layers of the integrated circuit chip. As a result, a layer(s), such as an interlayer dielectric between metal layers, can crack and become damaged, leading to reliability problems. Similarly, the wire-bonding process can cause cracking and damage to a layer(s) of the integrated circuit chip.

FIG. 1A illustrates a cross-sectional view of a semiconductor structure 100 of a conventional integrated circuit chip. As shown in FIG. 1A, the semiconductor structure 100 includes a pad metal layer 10 having an exposed surface 12, an interlayer dielectric (ILD) 40, and a lower metal layer 20. Moreover, the semiconductor structure 100 further includes an insulating dielectric 30 that covers the perimeter area of the pad metal layer 10. Additionally, the semiconductor structure 100 includes a plurality of vias 25 formed in the interlayer dielectric (ILD) 40 to electrically couple the pad metal layer 10 and the lower metal layer 20. As depicted in FIG. 1A, the vias 25 are formed below the exposed surface 12 of the pad metal layer 10. This illustrates how the stress, induced by the probe instrument, propagates to lower layers of the integrated circuit chip through the vias 25.

A top view of the semiconductor structure 100 of the conventional integrated circuit chip of FIG. 1A is shown in FIG. 1B. The top view of FIG. 1B depicts the insulating dielectric 30 and the exposed surface 12 of the pad metal layer 10. Moreover, the symbols 60 illustrate the position of the vias 25 below the pad metal layer 10.

SUMMARY OF THE INVENTION

A semiconductor device is disclosed and provided. The semiconductor device includes a pad metal layer having a perimeter area and a center area. Further, the semiconductor device has a lower metal layer having a plurality of apertures below the center area of the pad metal layer. Moreover, an interlayer dielectric is formed between the pad metal layer and the lower metal layer. In an embodiment, the semiconductor device also includes a plurality of vias formed in the interlayer dielectric. The vias electrically couple the pad metal layer and the lower metal layer. Additionally, the vias are located below the perimeter area of the pad metal layer.

These and other advantages of the present invention will no doubt become apparent to those of ordinary skill in the art after having read the following detailed description of the preferred embodiments, which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

Figure 2:
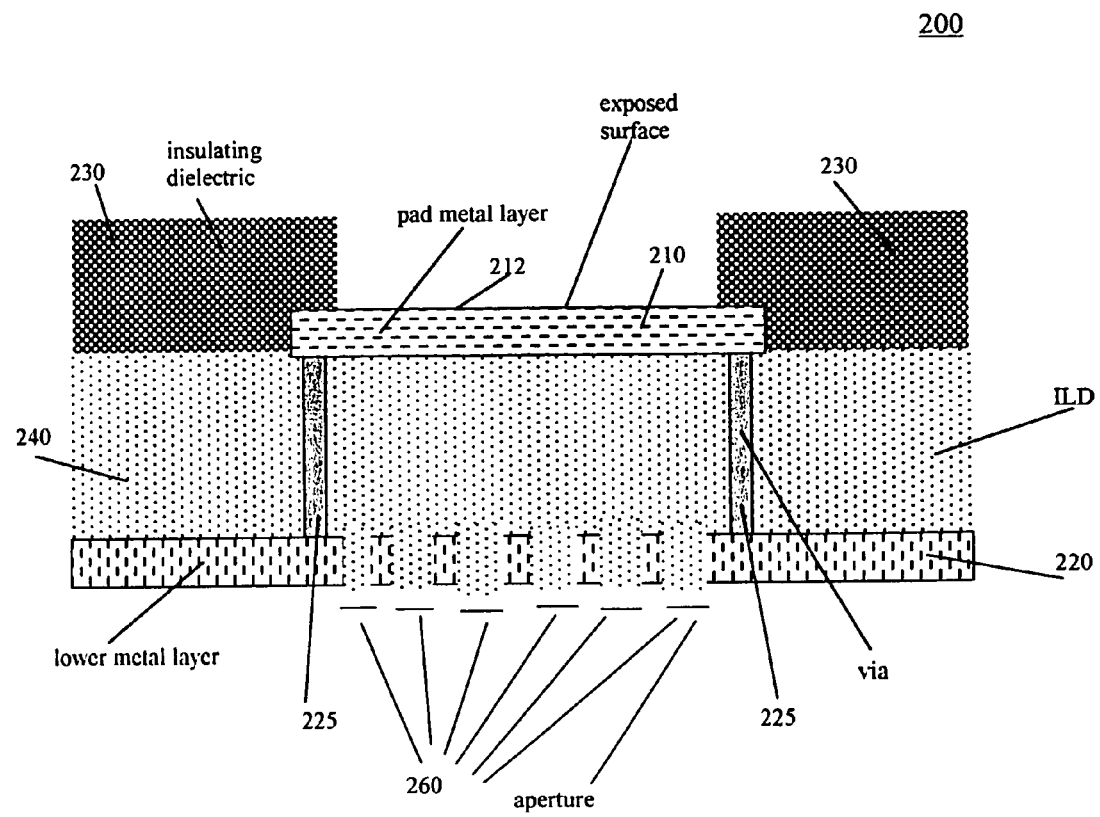
FIG. 2 illustrates a cross-sectional view of a semiconductor structure of a semiconductor device in accordance with an embodiment of the present invention.

FIG. 2 illustrates a cross-sectional view of a semiconductor structure 200 of a semiconductor device in accordance with an embodiment of the present invention. In an embodiment, the semiconductor device is an integrated circuit chip. As shown in FIG. 2, the semiconductor structure 200 includes a pad metal layer 210 having an exposed surface 212, an interlayer dielectric (ILD) 240, and a lower metal layer 220.

Moreover, the semiconductor structure 200 further includes an insulating dielectric 230 that covers the perimeter area of the pad metal layer 210. Also, the lower metal layer 220 has a plurality of apertures 260 below the center area (or exposed surface 212) of the pad metal layer 210, whereas the interlayer dielectric (ILD) 240 can fill the apertures 260. Additionally, the semiconductor structure 200 includes a plurality of vias 225 formed in the interlayer dielectric (ILD) 240 to electrically couple the pad metal layer 210 and the lower metal layer 220. In an embodiment, the vias 225 are filled with tungsten.

Figure 1A:
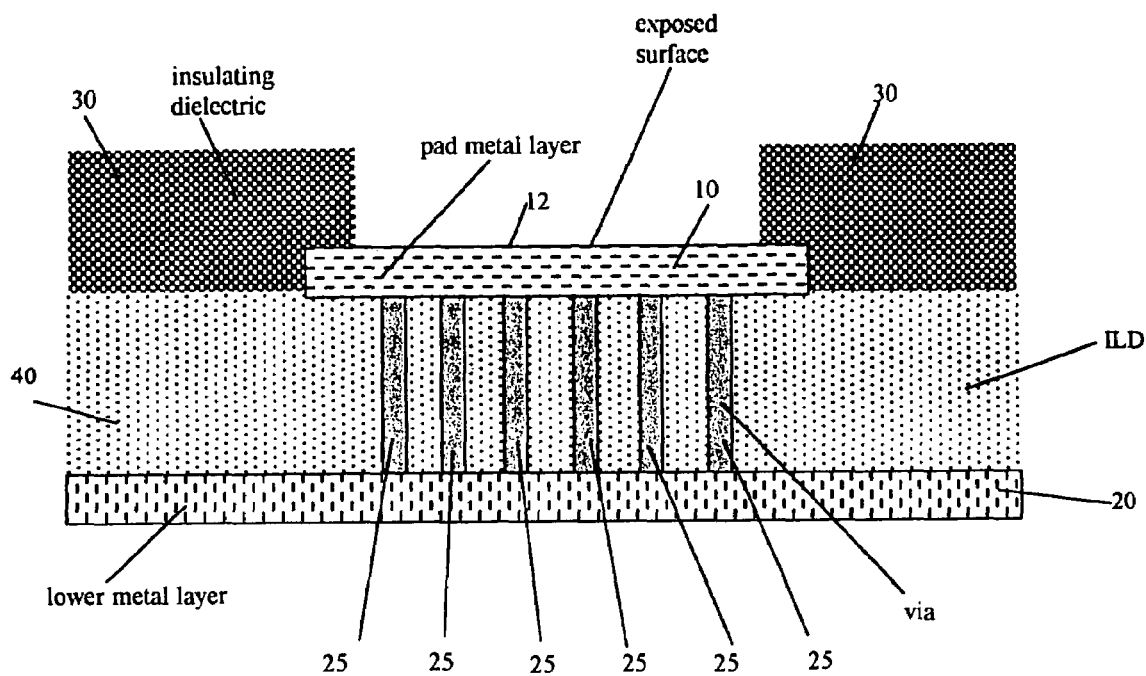
FIG. 1A illustrates a cross-sectional view of a semiconductor structure of a conventional integrated circuit chip.

Unlike in FIG. 1A, the vias 225 are formed below the perimeter area of the pad metal layer 210 rather than below the center area (or exposed surface 212) of the pad metal layer 210. This relieves the stress induced by performing the probing process or the wire-bonding process since the center area (or exposed surface 212) usually experiences the most amount of stress that can be propagated to lower layers. Moreover, the amount of stress that propagates to lower layers of the integrated circuit chip through the vias 225 is significantly reduced, decreasing cracking and damage to lower layer(s) of the integrated circuit chip.

It should be understood that the semiconductor structure 200 can also be implemented such that a metal layer(s), which is below the lower metal layer 220, has a plurality of apertures similar to the apertures 260 of the lower metal layer 220. Moreover, the vias between the lower metal layer 220 and this metal layer can be located below the vias 225 between the pad metal layer 210 and the lower metal layer 220 to form a linear vertical arrangement of vias.

Figure 3A:
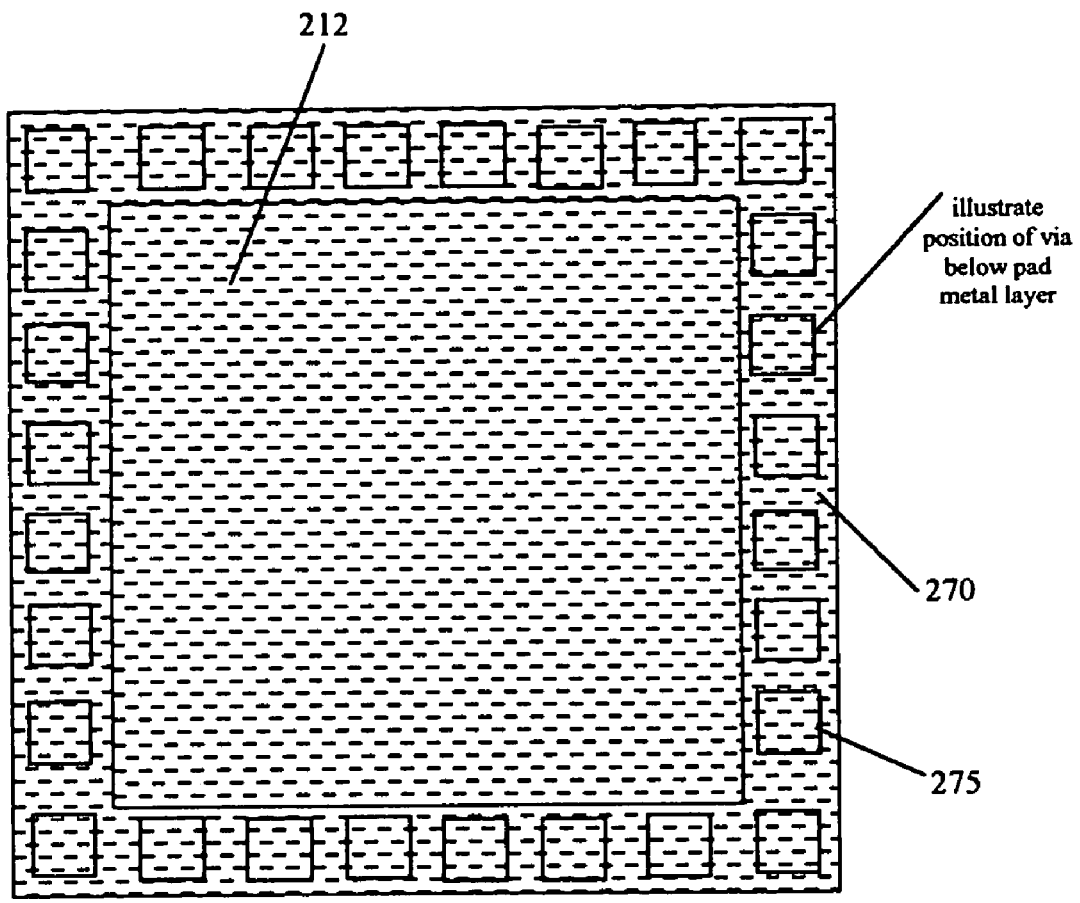
FIG. 3A illustrates a top view of the pad metal layer of the semiconductor structure of the semiconductor device of FIG. 2.

FIG. 3A illustrates a top view of the pad metal layer of the semiconductor structure 200 of the semiconductor device of FIG. 2. The top view of the pad metal layer 210 is depicted, showing the perimeter area 270 and the center area (or exposed area) 212 of the pad metal layer 210. Moreover, the symbols 275 illustrate the position of the vias 225 below the pad metal layer 210. As illustrated in FIG. 3A, the vias 225 are positioned in a ring arrangement below the perimeter area 270 of the pad metal layer 210.

Figure 1B:
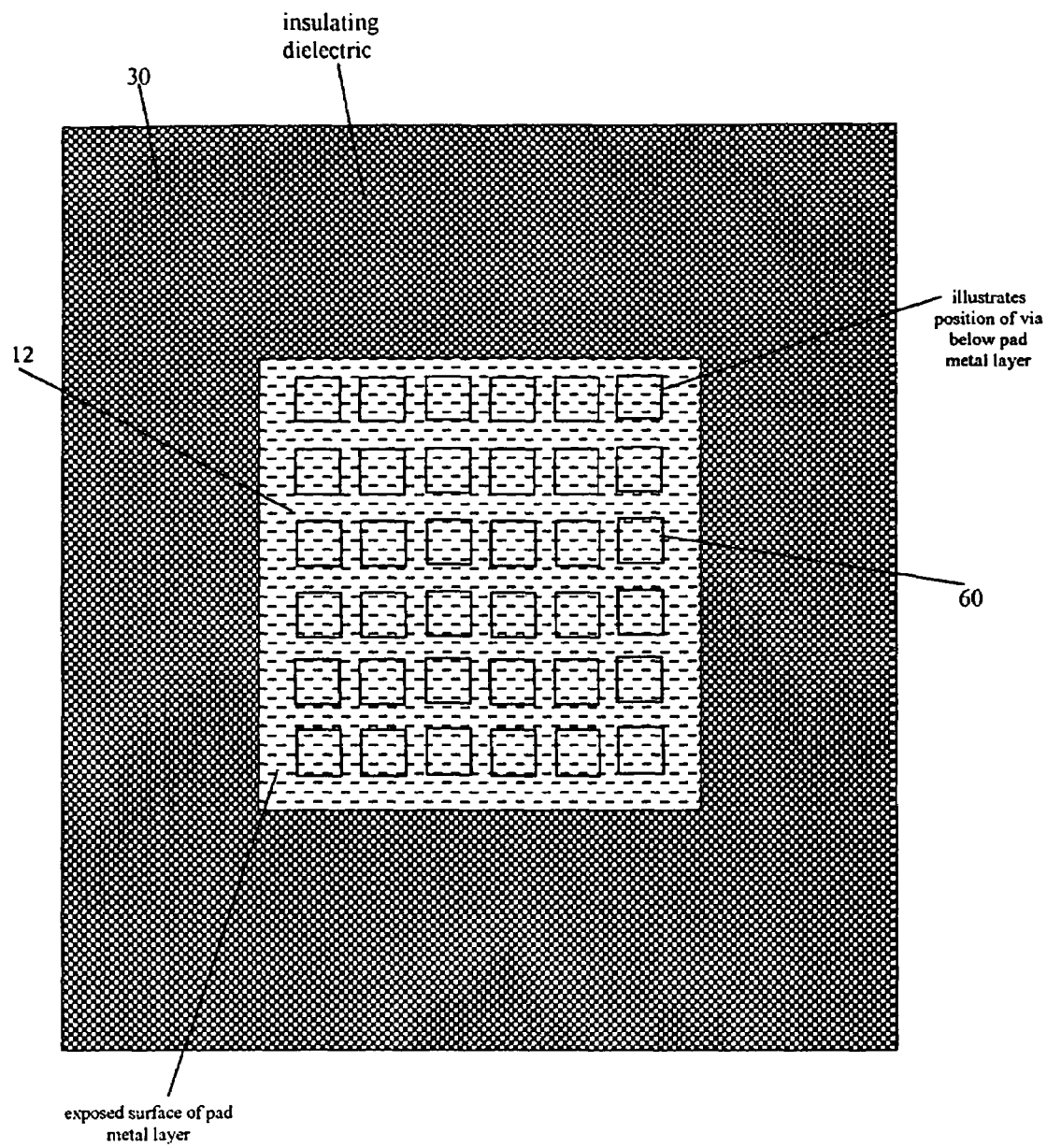
FIG. 1B illustrates a top view of the semiconductor structure of the conventional integrated circuit chip of FIG. 1A.
Figure 3B:
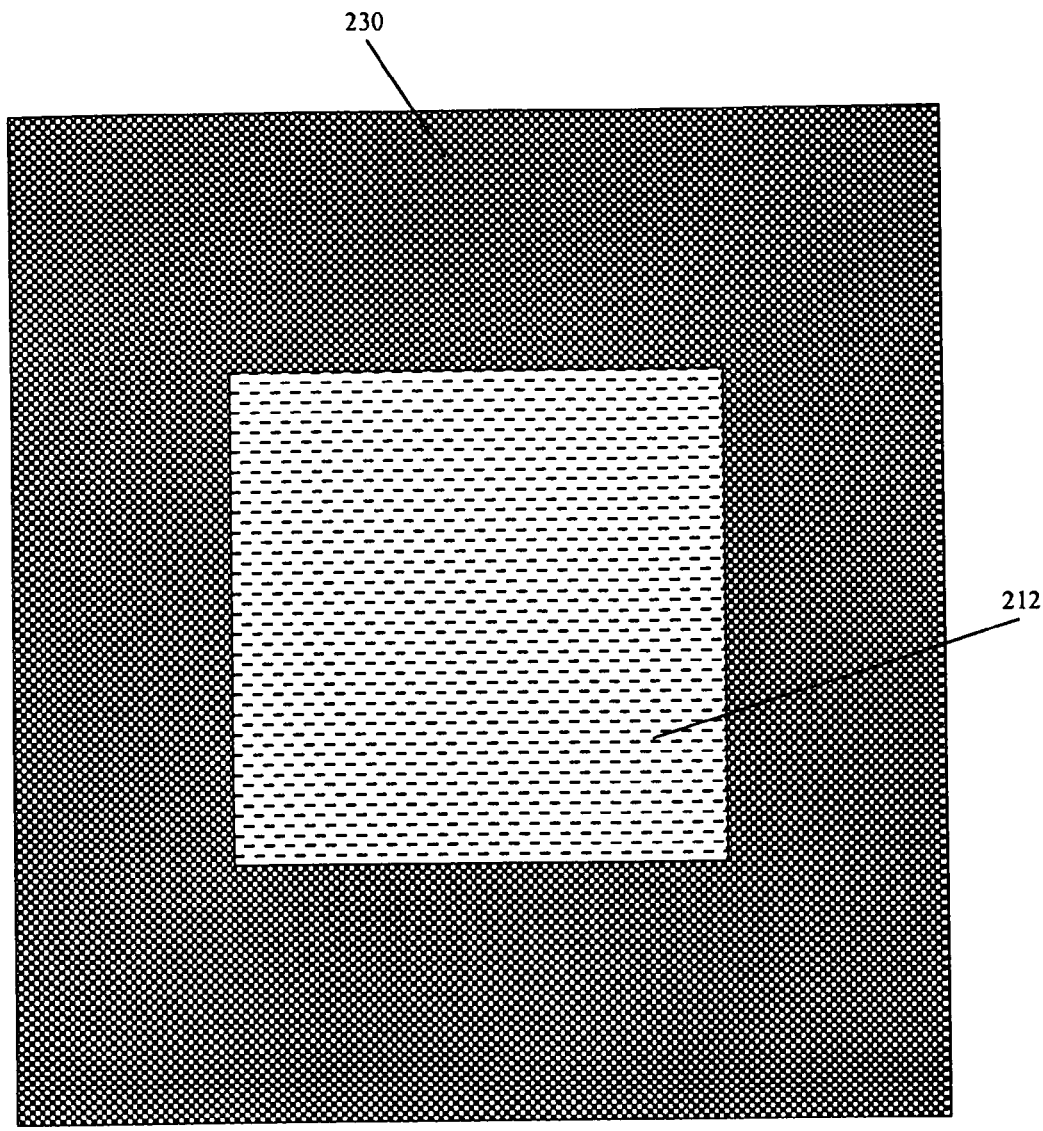
FIG. 3B illustrates a top view of the semiconductor structure of the semiconductor device of FIG. 2.

Moreover, in FIG. 3B a top view of the semiconductor structure 200 of the semiconductor device of FIG. 2 is shown. The top view of FIG. 3B depicts the insulating dielectric 230 and the center area (or exposed surface) 212 of the pad metal layer 210. Unlike FIG. 1B, the vias 225 are located below perimeter area 270 (FIG. 3A) of the pad metal layer 210, whereas the perimeter area 270 is covered by the insulating dielectric 230.

Figure 4:
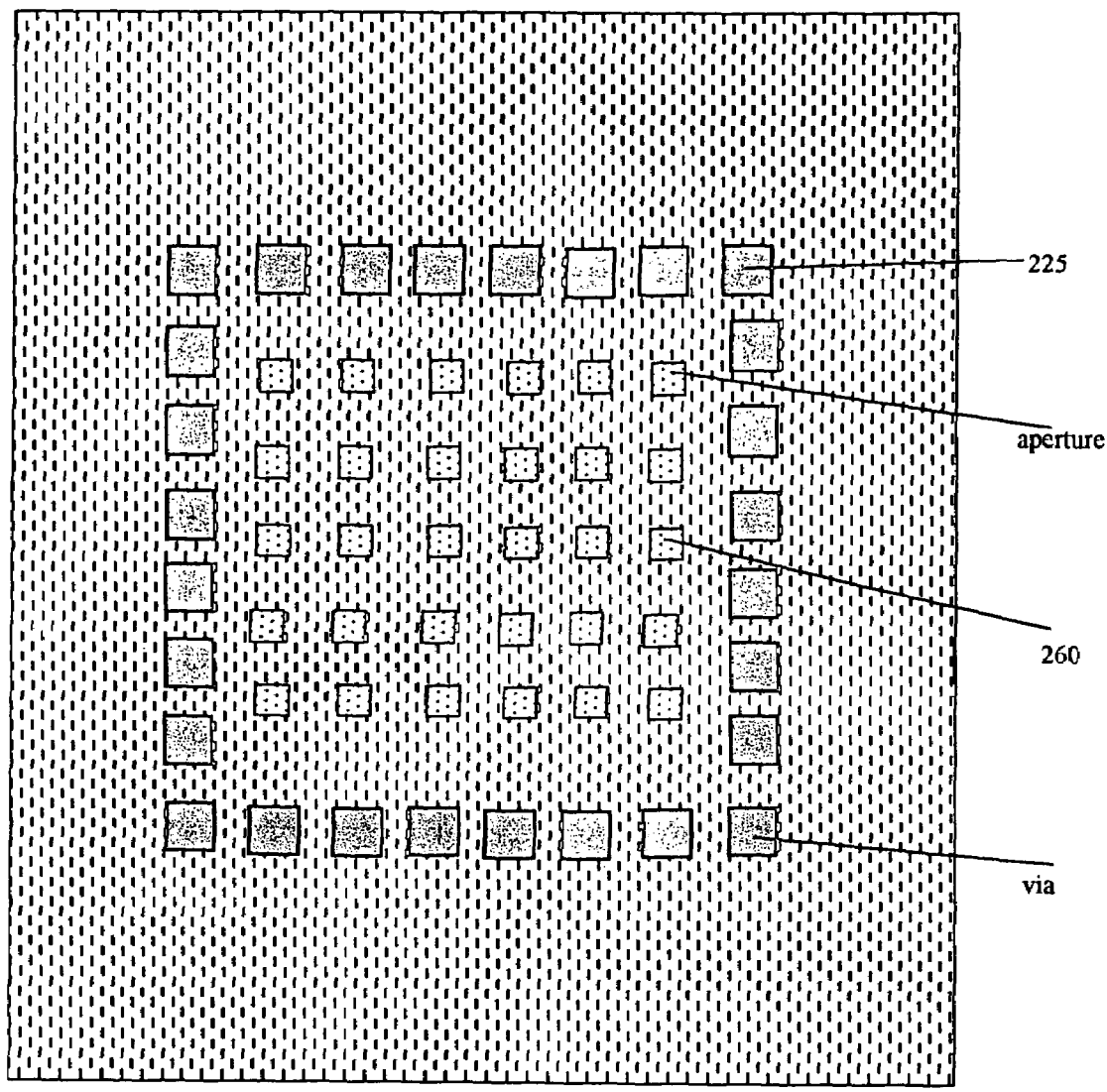
FIG. 4 illustrates a top view of the lower metal layer of the semiconductor structure of the semiconductor device of FIG. 2.

FIG. 4 illustrates a top view of the lower metal layer 220 of the semiconductor structure 200 of the semiconductor device of FIG. 2. The lower metal layer 220 has a plurality of apertures 260 below the center area (or exposed surface 212) of the pad metal layer 210. Moreover, the vias 225 are in a ring arrangement around the apertures 260. Also, the interlayer dielectric (ILD) 240 fills the apertures 260.

The pitch, dimensions, and number of apertures 260 can be selected such that release of sufficient stress (e.g., caused by the probing process or the wire-bonding process) is achieved to avoid cracking and damage to lower layer(s) of the integrated circuit chip.

Figure 5:
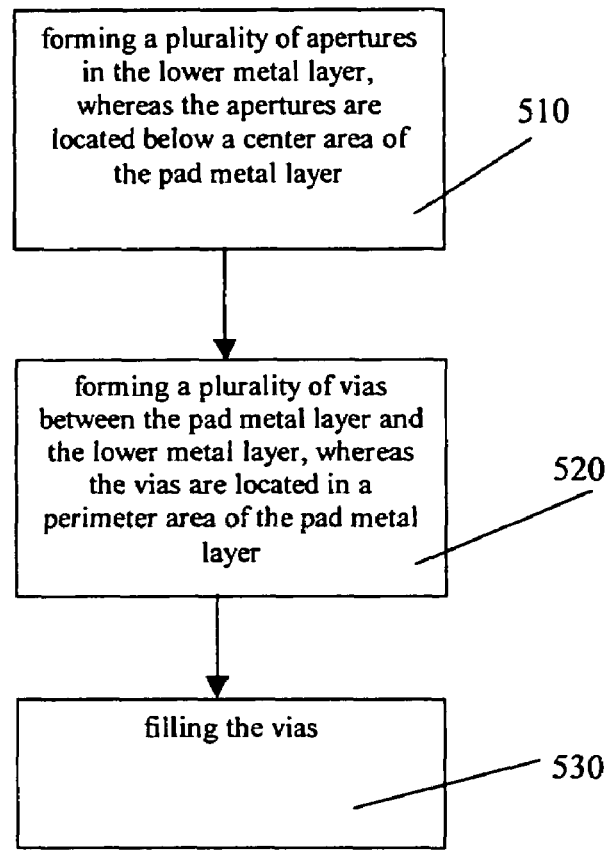
FIG. 5 illustrates a flow chart showing a method of electrically coupling a pad metal layer and a lower metal layer in a semiconductor device in accordance with an embodiment of the present invention.

FIG. 5 illustrates a flow chart showing a method 50 of electrically coupling a pad metal layer and a lower metal layer in a semiconductor device in accordance with an embodiment of the present invention. In an embodiment, the semiconductor device is an integrated circuit chip.

At Step 510, a plurality of apertures are formed in the lower metal layer. The pad metal layer has a perimeter area and a center area. The apertures are located below the center area (or exposed surface) of the pad metal layer Continuing, at Step 520, a plurality of vias are formed in an interlayer dielectric between the pad metal layer and the lower metal layer. The vias are located below the perimeter area of the pad metal layer.

Moreover, at Step 530, the vias are filled with a metal. In an embodiment, the metal is tungsten. Hence, this electric coupling method addresses the cracking and damage to lower layer(s) of the integrated circuit chip.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A semiconductor device comprising:
  a pad metal layer having a perimeter area and a center area wherein said center area is formed to accommodate a probe;
  a lower metal layer having a plurality of apertures below said center area of said pad metal layer, wherein said apertures are arranged into a plurality of rows each row comprising more than one of said apertures and a plurality of columns each column comprising more than one of said apertures;
  an interlayer dielectric formed between said pad metal layer and said lower metal layer wherein said interlayer dielectric covers a portion of both the bottom and the sides of said pad metal layer;
  a plurality of vias formed in said interlayer dielectric, wherein said plurality of vias electrically couple said pad metal layer and said lower metal layer, and wherein said plurality of vias form a ring arrangement that is located above and outside of the region occupied by said apertures in said lower metal layer and below an outermost perimeter area of said pad metal layer; and
  an insulating dielectric layer that covers said perimeter area of said pad metal layer wherein said insulating dielectric layer covers a portion of both the top and the sides of said pad metal layer and extends in the direction of said center area laterally inside of the innermost perimeter of said plurality of vias with said area inside of said innermost perimeter being free of vias.

2. The semiconductor device as recited in claim 1 wherein said vias are filled with tungsten.

3. The semiconductor device as recited in claim 1 wherein a probing process is performed on said center area of said pad metal layer.

4. The semiconductor device as recited in claim 1 wherein a wire-bonding process is performed on said center area of said pad metal layer.

5. The semiconductor device as recited in claim 1 wherein said semiconductor device is an integrated chip.

* * * * *